US006531807B2

(12) United States Patent
Tanaka et al.

(10) Patent No.: US 6,531,807 B2
(45) Date of Patent: Mar. 11, 2003

(54) PIEZOELECTRIC DEVICE

(75) Inventors: Masako Tanaka, Suwa (JP); Takashi Endo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/124,486

(22) Filed: Apr. 18, 2002

(65) Prior Publication Data
US 2002/0180315 A1 Dec. 5, 2002

(30) Foreign Application Priority Data
May 9, 2001 (JP) ........................................ 2001-139271

(51) Int. Cl.[7] .............................................. H01L 41/053
(52) U.S. Cl. ......................................... 310/344; 310/348
(58) Field of Search ................................... 310/344, 348

(56) References Cited

U.S. PATENT DOCUMENTS

| 4,282,498 A | * | 8/1981 | Iizawa ........................ 310/340 |
| 4,750,246 A | * | 6/1988 | Pollard ....................... 29/25.35 |
| 4,985,687 A | * | 1/1991 | Long .......................... 219/210 |
| 5,041,800 A | * | 8/1991 | Long et al. .................. 219/210 |
| 5,053,671 A | * | 10/1991 | Kobayashi et al. ......... 310/324 |

FOREIGN PATENT DOCUMENTS

| JP | 54-124692 | * | 9/1979 | ................. 310/344 |
| JP | A 6-48216 | | 2/1994 | ........... B60K/31/00 |
| JP | A 8-316732 | | 11/1996 | ............ H03B/5/32 |
| JP | A 9-107186 | | 4/1997 | ............ H05K/7/14 |
| JP | A 9-284050 | | 10/1997 | ............ H03B/5/32 |
| JP | A 10-22735 | | 1/1998 | ............ H03B/5/32 |
| JP | A 11-186850 | | 7/1999 | ............ H03B/5/32 |

* cited by examiner

Primary Examiner—Thomas M. Dougherty
(74) Attorney, Agent, or Firm—Oliff & Berridge, PLC

(57) ABSTRACT

A package has a first region and a second region on one principal plane, and has a base including a ceramic board where wiring patterns to connect a quartz crystal resonator element and an IC chip for its driving are formed. In the base, a first sidewall enclosing the first region is arranged on the top side of the board, and the quartz crystal resonator element is mounted in a first void space delimited in its internal, and the IC chip is mounted in a second void space delimited by a second sidewall enclosing the second region. The first sidewall is formed to be higher than the second sidewall, a metal cover is seam welded at the upper end thereof, and the first void space is sealed in a vacuum or nitrogen atmosphere. The IC chip of the second region is resin sealed. In addition to the miniaturization, thinning and high-accuracy frequency adjustment, the present invention reduces or eliminates the stray capacity caused by the adsorption of gas that is generated from electronic components and wiring, package/wiring structure, and the like to reduce or prevent the reduction of variable amount of frequency and displays a high frequency stability and aging characteristics. It is particularly suited to a high-frequency oscillator with a large variable amount of frequency.

8 Claims, 5 Drawing Sheets

Fig. 1
(A)
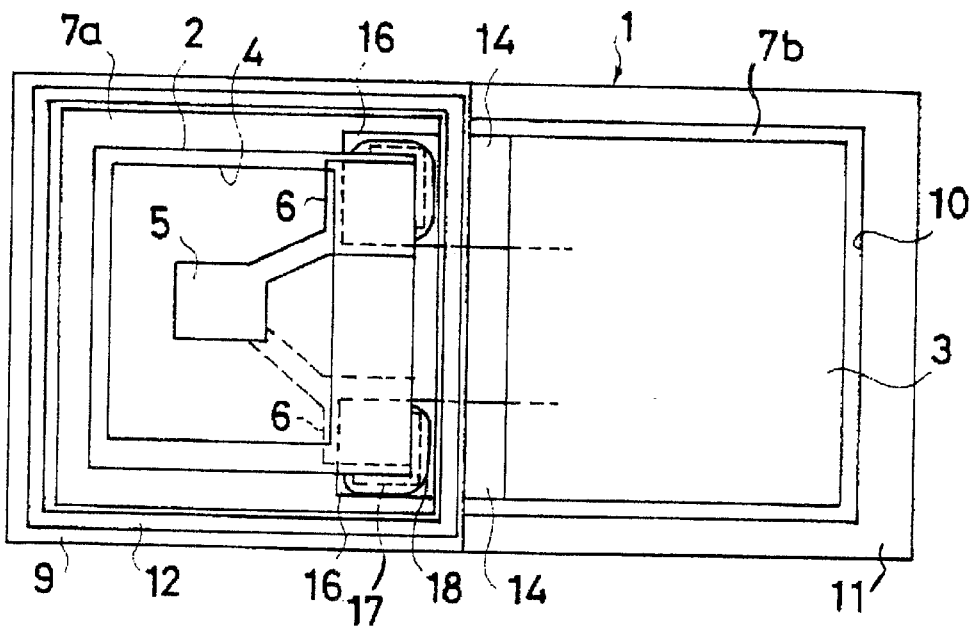
(B)
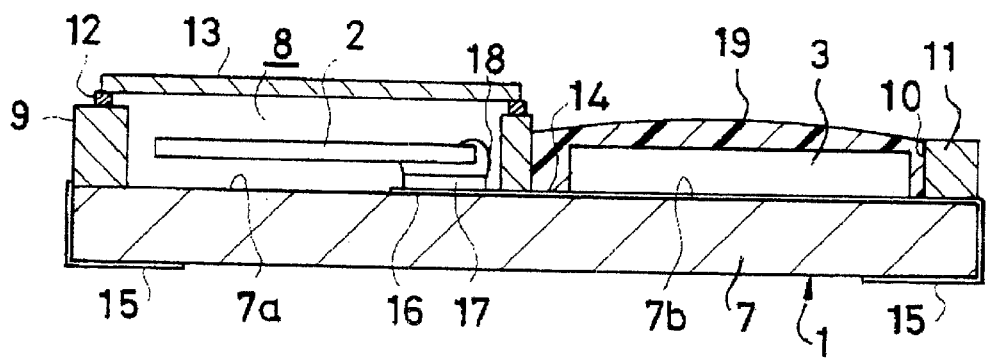

PIEZOELECTRIC DEVICE

BACKGROUND OF THE INVENTION

1. Field of Invention

The present invention relates to a piezoelectric oscillator used in various electronic machines. In particular, the invention relates to a piezoelectric oscillator which is loaded with a quartz crystal or other piezoelectric resonator element, a semiconductor IC element with an oscillation circuit to drive the resonator element, such as an IC chip, and the like and/or discrete electronic components.

2. Description of Related Art

Piezoelectric devices, such as a piezoelectric resonator utilized as a clock source of electronic circuits, oscillators in which a piezoelectric resonator and an IC chip are sealed in same package, and the like have been widely used in various electronic machines, including but not limited to OA machines, such as information communication machines, and computers, and the like, livelihood machines, and the like. Further, the piezoelectric devices must be miniaturized and thinned in order to miniaturize and thin these electronic machines, and many surface-mounting type piezoelectric devices suited for mounting to the circuit boards of the devices have been adopted. More recently, piezoelectric devices that are actuated at the high frequency of 80 MHz or over of the fundamental wave have been required to correspond to the high communication frequency and high speed of systems associated with the large capacity and high speed of information transmission in the field of information communication based on portable telephones.

For example, a related art surface-mounting type quartz crystal oscillator includes a hollow portion formed on a laminated circuit board formed of at least three insulating layers. IC chips and electronic components (resistors) are arranged in a cavity formed at the bottom of the hollow portion. A quartz resonator element is arranged in the upper part of the hollow portion. A cover is joined to the upper end of the laminated circuit board to seal it to be air-tight. Terminal electrodes for an external connection are formed on the rear face of the laminated circuit board. This structure is disclosed in Japanese Laid Open Utility Model H6-48216. In the surface-mounting type piezoelectric oscillator described in Japanese Laid Open Patent Application H11-186850, a reactance component due to wiring is reduced, and an enhancement of high-frequency characteristics is sought simultaneously with the miniaturization and thinning by receiving a quartz crystal resonator and its driving IC chip in the same case, directly connecting the driving IC chip with solder bumps to wiring patterns formed on the inner bottom of the case and electrically fixing/keeping the quartz crystal resonator element above it to electrically connect the element to the wiring patterns. In the quartz crystal oscillator described in Published Unexamined Patent Application H9-107186, an oscillating element and a control element are mounted on a ceramic board, and a resin case where external connection terminals are connected to electrodes of the ceramic board is externally arranged covers the ceramic board, and then is sealed to prevent wire breakage caused by differences in the thermal expansion coefficients during mounting to the mounting board of another machine.

SUMMARY OF THE INVENTION

In order to maintain high-precision frequency during the use of a piezoelectric oscillator, it is necessary to synchronize with other reference frequencies, and to always maintain the frequency at a desirable value or range. Moreover, deviations of the frequency that are caused by temperature changes and the like must be corrected to correspond to ambient changes, such as temperature, and the like. To realize this, for example, a function that is capable of fully correcting the frequency difference from the reference frequency with a variable capacitor changed with a control voltage and the like is required for the piezoelectric oscillator.

A piezoelectric oscillator includes a bottom wall defining a circuit pattern that is formed to connect a piezoelectric resonator element and an IC chip, and a circular sidewall with an opening to receive them are laminated and burned to form a ceramic base. An adjustment auxiliary portion to integrally extend the bottom wall and the circular sidewall is arranged on one end side of the ceramic base. Adjustment terminals to connect the circuit pattern are formed on an external surface of the ceramic. This structure is disclosed in Japanese Laid Open Patent Application H10-22735 as an example of TCXO (temperature compensated crystal oscillator). This piezoelectric oscillator reduces or prevents the occurrence of strain or warp in the manufacture of the ceramic base by writing compensation data in a memory circuit of the IC chip via the adjustment terminals, and then dividing the adjustment auxiliary portion.

An equivalent circuit model of such a voltage controlled crystal oscillator is shown in FIG. 5. The frequency change of a quartz crystal oscillator to the change of load capacity CL is expressed by the following equation (1). In the application of communication machines used at a very high frequency, such as portable telephones, the frequency variable width, i.e., $\Delta F$ of the quartz crystal oscillator is as large as possible, therefore $\gamma = C0/C1$ is preferably decreased.

$$\Delta F = \frac{1}{2\gamma\left(1 + \frac{CL}{C0}\right)} \quad (1)$$

$$\text{Here,} \quad \gamma = \frac{C0}{C1}$$

However, an actual quartz crystal oscillator has a stray capacity $C_{pp}$ as shown in FIG. 5. In this case, the apparent parallel capacity becomes $(C0+C_{pp})$. Therefore, the frequency change $\Delta F$ of the quartz crystal oscillator is corrected as the following equation (2).

$$\Delta F' = \frac{1}{2\gamma\left(1 + \frac{CL}{C0 + C_{pp}}\right)} \quad (2)$$

$$\text{Here,} \quad \gamma' = \frac{C0 + C_{pp}}{C1}$$

From equation (2), it is determined that if the stray capacity $C_{pp}$ increases, the frequency change $\Delta F$ to the load capacity CL decreases, and that the higher the frequency, the greater the stray capacity $C_{pp}$. This represents a big problem because high accuracy is required for an AT cut quartz crystal resonator that is actuating at a very high frequency.

The capacity of the quartz crystal element itself, an capacity between lead-out electrodes that are formed on a quartz crystal resonator element, an capacity generated between terminals of a package and an capacity generated between the quartz crystal resonator element and the package, and the like are considered as the reasons for such a stray capacity. The inventors confirmed that the stray capacity correlating to the package is $C_{pp} \approx$ (nearly equal) C0 at 80 MHz or higher in various piezoelectric materials, especially in the case of quartz crystal. Therefore, its influence on the frequency change is large.

As with the quartz crystal oscillators described in Japanese Laid Open Patent Application H11-186850 and Japanese Laid Open Patent Application H9-107186, in a structure where a quartz crystal resonator and electronic components, such as an IC utilized to drive and the like are loaded in the same package, the stray capacity that is generated between them decreases and therefore is favorable. However, a concern exists that a gas generated from the bumps of electronic components and electrode pads, as well as an adhesive used to fix them, will be adsorbed on the surface of the quartz crystal resonator element, and will exert a negative influence on the vibration characteristics thereof. The decrement of frequency caused by the adsorption of such a gas is expressed by the following equation (3), and the higher the frequency, the greater the decrement. For example, where the same amount of gas is adsorbed on the quartz crystal resonator element, the frequency decrement 1 ppm at a frequency of 20 MHz becomes 25 ppm at a frequency of 100 MHz.

$$\Delta f = \frac{W_{ab}}{p_q \cdot V_q} \cdot f^2 \quad (3)$$

where, $W_{ab}$: the weight of adsorbed gas on electrode surface (g/cm$^2$)

$P_q$: the density of quartz crystal (g/cm$^3$)

$V_q$: the propagation velocity in quartz crystal f: the resonance frequency

Thus, the quartz crystal resonator that is actuating at a very high frequency is very sensitive to ambient gas and is easily affected. Therefore, it is desirable that other electronic components not be loaded in same atmosphere. For the quartz crystal oscillator described in Japanese Laid Open Patent Application H8-316732, in order to prevent the deviation of the resonance frequency caused by the adsorption of a gas that is generated from an adhesive to join a cover after sealing the case, a first receiver is arranged in the case and a second receiver is arranged at its bottom, an oscillation circuit, such as IC and the like, is received in the first receiver, a quartz crystal resonator element is loaded in the second receiver, and sealed with a cap and built into the case. Then the frequency is measured and the IC is adjusted in a state equivalent to the piezoelectric resonator. Then, the frequency is adjusted for residual strain in the manufacture of the quartz crystal resonator element and the strain caused by fixing it to the case. However, the quartz crystal oscillator disclosed in JP 732 is subject to the problem that the thinning and miniaturization of the entire package are restricted because another air-tight sealed empty chamber for the quartz crystal resonator is arranged in an air-tight sealed container to make the cover into a dual structure.

Accordingly, the present invention addresses the mentioned problems. The invention provides a piezoelectric device, in which a piezoelectric resonator element and electronic components to constitute its oscillation circuit are loaded in same package, and that effectively reduces or prevents the reduction of a variable amount of frequency caused by a stray capacity due to the adsorption of a gas that is generated from the electronic components and wiring, package or wiring structure, and the like, adjusts the frequency with high accuracy corresponding to the requirements of miniaturization and thinning, and is particularly suitable for uses of a high-frequency oscillator with a fundamental wave of 80 MHz or higher.

To achieve the above, the present invention provides a piezoelectric device that includes a package having a board to form wiring patterns on one principal plane with a first region and a second region, a first sidewall arranged on the board so as to enclose the first region and delimit a first internal void space and a cover to air tightly join to the upper end of the first sidewall and seal the first void space to be air-tight, a piezoelectric resonator element connected to the wiring patterns and mounted in the first void space and electronic components connected to the wiring patterns and mounted in the second region. The electronic components and the wiring patterns of the second region are resin sealed.

Thus, high frequency stability and aging characteristics are obtained by sealing the piezoelectric resonator element to be air-tight in the first void space that provides an atmosphere that is different from the electronic components because of no stray capacity caused by the adsorption of a gas that is generated from the electronic components and the like after sealing. There is also no occurrence of stray capacity, as in a wiring structure in which the wiring patterns formed on multiple laminated sheets are interlayer connected, on account of a wiring structure in which the piezoelectric resonator element and the electronic components are directly connected to the wiring patterns that are formed on the board which is the bottom plate of the package. Thus, there is no concern of producing a deviation of frequency caused by such a stray capacity. Moreover, frequency adjustment can be made with high accuracy by adjusting the electronic components of the second region in a state in which the piezoelectric resonator element is sealed to be air-tight. Furthermore, unlike the quartz crystal oscillator that is disclosed in Japanese Laid Open Patent Application H8-316732, thinning and miniaturization of entire package is possible because there is no need to make the cover into a dual structure.

The above structure provides the following advantages.

In accordance with the present invention, since the piezoelectric resonator element is air-tightly sealed in the first void space with an atmosphere that is isolated from the electronic components, no adsorption of gas that is generated from the electronic components exists. Moreover, since the piezoelectric resonator element and the electronic components are directly connected to the wiring patterns that are formed on the board, there is no concern that the stray capacity occurs and causes deviation in frequency due to the gas adsorption caused by such a piezoelectric resonator element and the wiring structure of package. Accordingly, the present invention enables the display of high frequency stability and aging characteristics as well as high-accuracy frequency adjustment by adjusting the electronic components of the second region. A surface-mounting piezoelectric device that can be miniaturized and thinned is thus obtained. Particularly, the present invention enables the increase of the variable width of frequency in the case of applying it to a voltage controlled high-frequency oscillator, and thus it is favorable for use in communication apparatus.

BRIEF DESCRIPTION OF THE DRAWINGS

FIG. 1(A) is a plan view showing a quartz crystal oscillator based on the present invention, and FIG. 1(B) is a longitudinal sectional view thereof;

DETAILED DESCRIPTION OF PREFERRED EMBODIMENTS

Figure 2:
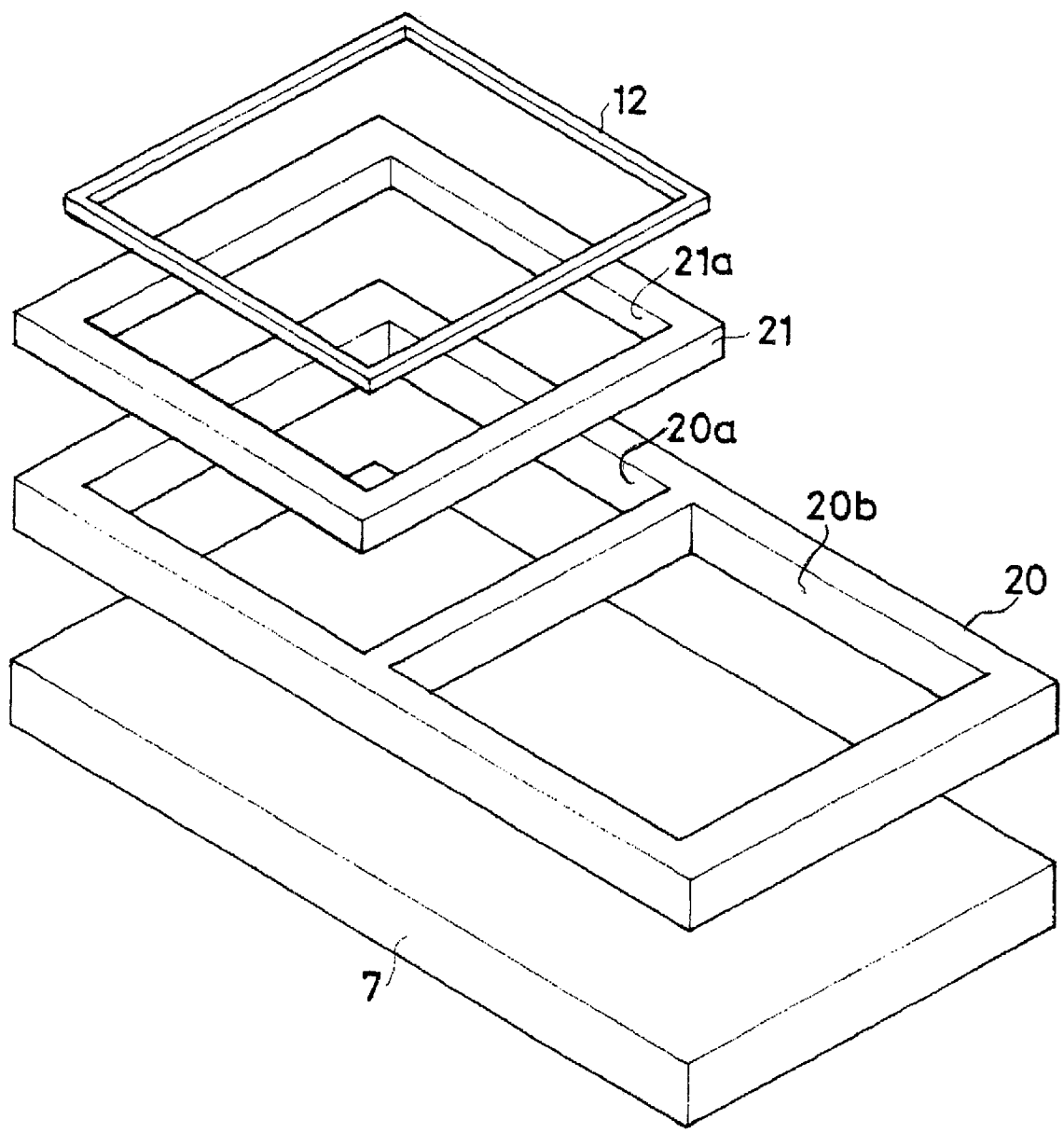
FIG. 2 is an exploded oblique view of base shown in FIG. 1.

In some embodiments, an acceptably operating piezoelectric oscillator having the above characteristics is obtained by the electronic components constituting an oscillation circuit to drive the piezoelectric resonator element. Particularly, the variable width of frequency is increased in a very high frequency oscillator. Moreover, an acceptably operating voltage controlled oscillator is obtained by the electronic components including a variable capacitor.

In another embodiment, the package further has a second sidewall that defines a lower height than the first sidewall formed on the board so as to enclose the second region and delimit the second void space to receive the electronic components internally. Because the first sidewall has a height that is above the second sidewall, the cover is easily joined, and a reliable resin sealing of the second region is facilitated. Particularly, where the cover includes a metal plate and is joined to the first sidewall by seam welding, a space that is necessary to interlock jigs with the cover and the seal ring can be secured above the second sidewall. In that case, the deviation of the frequency caused by the adsorption of the gas after sealing the piezoelectric resonator element does not occur, and superior aging characteristics are obtained with high frequency stability because the first void space can be maintained in an atmosphere where there is no undesirable gas, such as a gas that can be generated in the case of joining the cover with a low-melting glass.

Moreover, if the electronic components of the second region and the wiring patterns are resin sealed with a potting material that is injected into the inner side of the second sidewall, the potting material does not flow out of the second region, the operation is simple, and a reliable, sealing is possible.

In some embodiments, the wiring patterns have test terminals for the piezoelectric resonator element which is arranged in the second region and resin sealed. Since the frequency of the piezoelectric resonator element that is sealed in the first void space can be precisely measured, via the exclusive test terminals, before the resin sealing of the second region, and the wiring patterns are not exposed to the external of package after the resin sealing of the second region, there is no concern of external corrosion and noise which exert a negative influence, and the stability of frequency and vibration characteristics is secured.

In another embodiment, the structure of package and its assembly can be simplified by forming the first sidewall by laminating the ceramic sheets with an opening of the first void space on the board.

Suitable embodiments of the invention are described in detail hereafter, with reference to the attached drawings.

FIGS. 1(A) and (B) schematically show the structure of a quartz crystal oscillator, which is an embodiment of the piezoelectric device to which the present invention is applied. In this quartz crystal oscillator, an AT cut quartz crystal resonator element 2 and an IC chip 3 constituting an oscillation circuit to drive it are loaded on a package 1 made of an insulating material. The AT cut quartz crystal resonator element 2 of this embodiment has a so-called "inverted mesa structure", where an excitation electrode 5 is formed roughly at the center of a depressed thin-wall part 4 arranged on both the surface and the rear face of a quartz crystal resonator element forming a rectangle, and a pair of connection electrodes 6 are led out therefrom on one-end.

The package 1 has a base including a board 7, made of a ceramic material, that includes a first region 7a to mount the quartz crystal resonator element 2 on one principal plane, i.e., the top side and a second region 7b to mount an IC chip 3. A rectangular first sidewall 9 which encloses the first region 7a and delimits a first void space 8 to receive the quartz crystal resonator element 2 internally, and a rectangular second sidewall 11 which encloses the second region 7b and delimits a second void space 10 to receive the IC chip 3 internally, are adjoined and integrally arranged on the top side of the board 7. The first sidewall 9 is formed to be higher than the second sidewall 11, and a metal cover 13 is air-tightly joined to the upper end thereof via a seal ring 12.

Wiring patterns 14 to connect the quartz crystal resonator element 2 and the IC chip 3 are formed on the principal plane of the board 7 and connected to external terminals 15 arranged on the other principal plane, i.e., the rear face of the board 7. These wiring patterns and external terminals are generally formed by screen printing metal wiring materials, such as W, Mo, and the like, on the surface of the ceramic board, and then plating Ni and/or Au thereon.

The wiring patterns 14 have a pair of connection terminals 16 for the quartz crystal resonator element 2 arranged in the first region 7a. Roughly rectangular electrode pads 17, which are made of a suitable conducting material and gold plated on their surface, are formed on the connection terminals 16, respectively. The connection electrodes 6 are glued to corresponding electrode pads 17 with a conductive adhesive 18. Therefore, the quartz crystal resonator element 2 is fixed on one side and supported almost horizontally and connected electrically.

In this embodiment, the two connection terminals 16 are arranged directly on the inner side of the first sidewall 9 near to the second region 7b around the middle. This enables the length of wiring to connect the quartz crystal resonator element 2 and the IC chip 3 to be minimized, thereby minimizing the influence of noise, and the like.

The wiring patterns 14 have connection terminals (not described) for an IC chip that is arranged in the second region 7b, to be connected thereto and the IC chip 3 is face-down bonded, e.g., by a flip chip mode. The IC chip can also be connected by wire bonding, but face-down bonding is favorable in reducing the height and seeking to thin the entire package. The IC chip 3 and the wiring patterns 14 exposed to the second region 7b are resin sealed with a potting material 19 that is filled into the second void space 10. This protects the IC chip and wiring patterns, as well as prevents a short between the electrodes and wiring due to foreign matter.

The base of the embodiment includes of a laminated structure of ceramic material sheets, as shown in FIG. 2. A ceramic sheet 20 having an opening 20a to construct the lower part of the first void space, and an opening 20b to construct the second void space 10, and ceramic sheets 21 having an opening 21a to construct the upper part of the first void space 8, are laminated and integrated on the one principal plane of the board 7 where the wiring patterns 14 are pre-formed. A metal seal ring 12 is further internally joined onto the ceramic sheets 21. Such a laminated structure is known in the package manufacture of the piezoelectric device, and is favorable because many bases can be simultaneously manufactured with large ceramic sheets.

The quartz crystal oscillator of the present embodiment is assembled according to the following procedure. First, a base provided by laminating ceramic sheets as described above in relation to FIG. 2 is prepared, an AT cut quartz crystal resonator element 2 is bonded to the electrode pads 17 corresponding to the connection electrodes 6 with a conductive adhesive 18, and then one-side is fixed in the first void space 8. After the conductive adhesive 18 is fully hardened and an undesirable gas is fully excluded from within the first void space 8, the base is disposed in a vacuum atmosphere or a nitrogen atmosphere, the cover 13 is seam welded at the upper end of the first sidewall 9 via the seal ring 12, and then the first void space 8 is sealed in a vacuum or a nitrogen atmosphere. Because the first sidewall 9 is arranged to be higher than the second sidewall 11, a space that is necessary to interlock jigs with the cover 13 and the seal ring 12 during the seam welding can be secured above the second sidewall 11. Moreover, an undesirable gas, as in the case of joining the cover 13 with a resin or a low-melting glass, does not occur, the first void space 8 can be maintained in an atmosphere that is free or substantially free of such a gas, the deviation of frequency that is caused by the gas adsorption after sealing the quartz crystal resonator element 2 does not occur, and thus high frequency stability and superior aging characteristics are obtained.

The fundamental vibration characteristics of the quartz crystal resonator element 2 are measured by using the wiring patterns 14 for connection of IC chip 3 arranged in the second region 7b. This enables the preliminarily exclusion of inferior products which do not display desirable vibration characteristics, and enhances manufacturing yield, and reduces manufacturing costs of the quartz crystal oscillator.

Subsequently, the IC chip 3 is face-down bonded in the second region 7b. After the oscillation characteristics of the IC chip 3 are confirmed by the external terminals 15 on the rear face of the board 7, and frequency adjustment is conducted by adjusting the IC chip 3 according to demand, a suitable potting material 18 is injected into the second sidewall 11, and the second void space 10 is filled so as to perfectly or substantially perfectly seal the IC chips and the exposed part of the wiring patterns. This enables completion of a quartz crystal oscillator based on the present invention.

In accordance with another embodiment of present invention, a variable capacitor can be mounted as a discrete electronic part in addition to the IC chip 3 in the second region 7b of the board 7, and then similarly resin sealed. This enables a voltage controlled crystal oscillator to be obtained, which can be thinned and miniaturized with high frequency stability and superior aging characteristics as with the above-mentioned embodiment.

Figure 3:
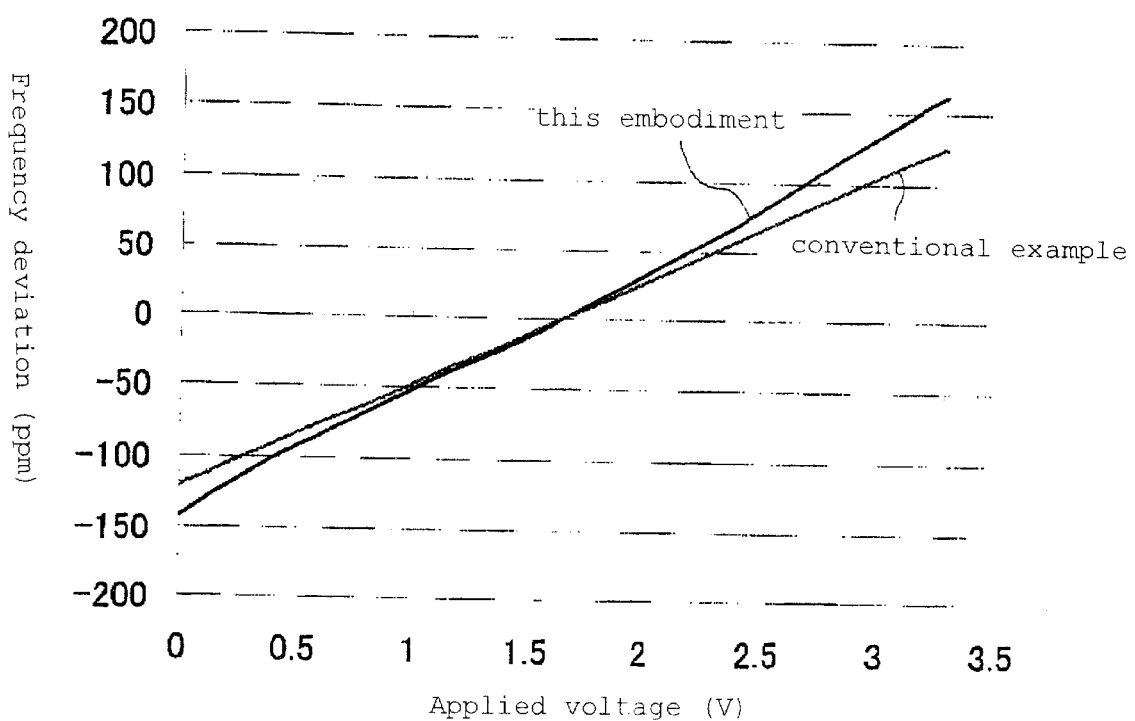
FIG. 3 is a graph showing the variable amount of frequency related to the applied voltage in a voltage controlled crystal oscillator based on the present invention.
Figure 4:
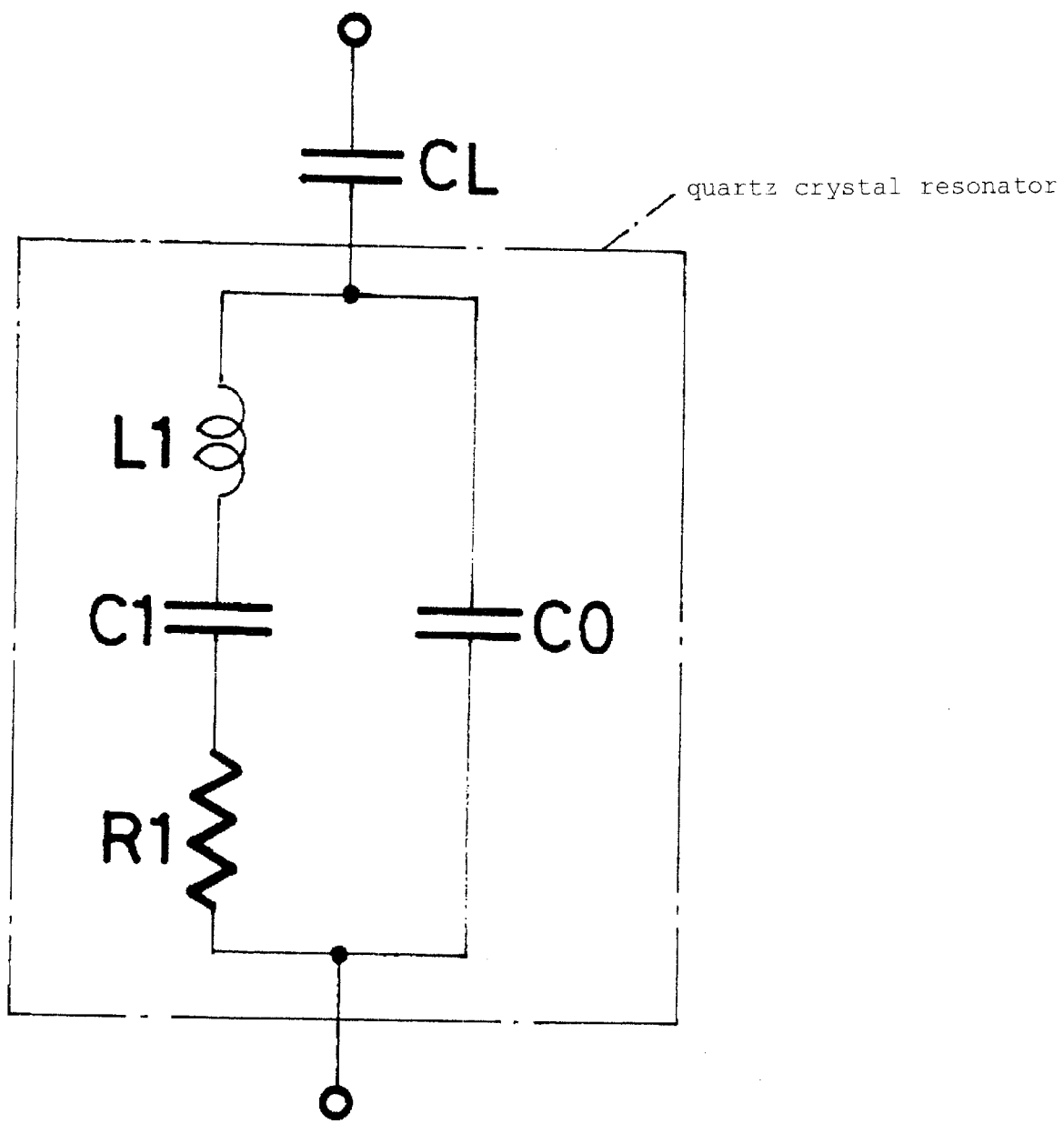
FIG. 4 is a schematic circuit diagram showing a theoretical equivalent circuit model of a quartz crystal oscillator.
Figure 5:
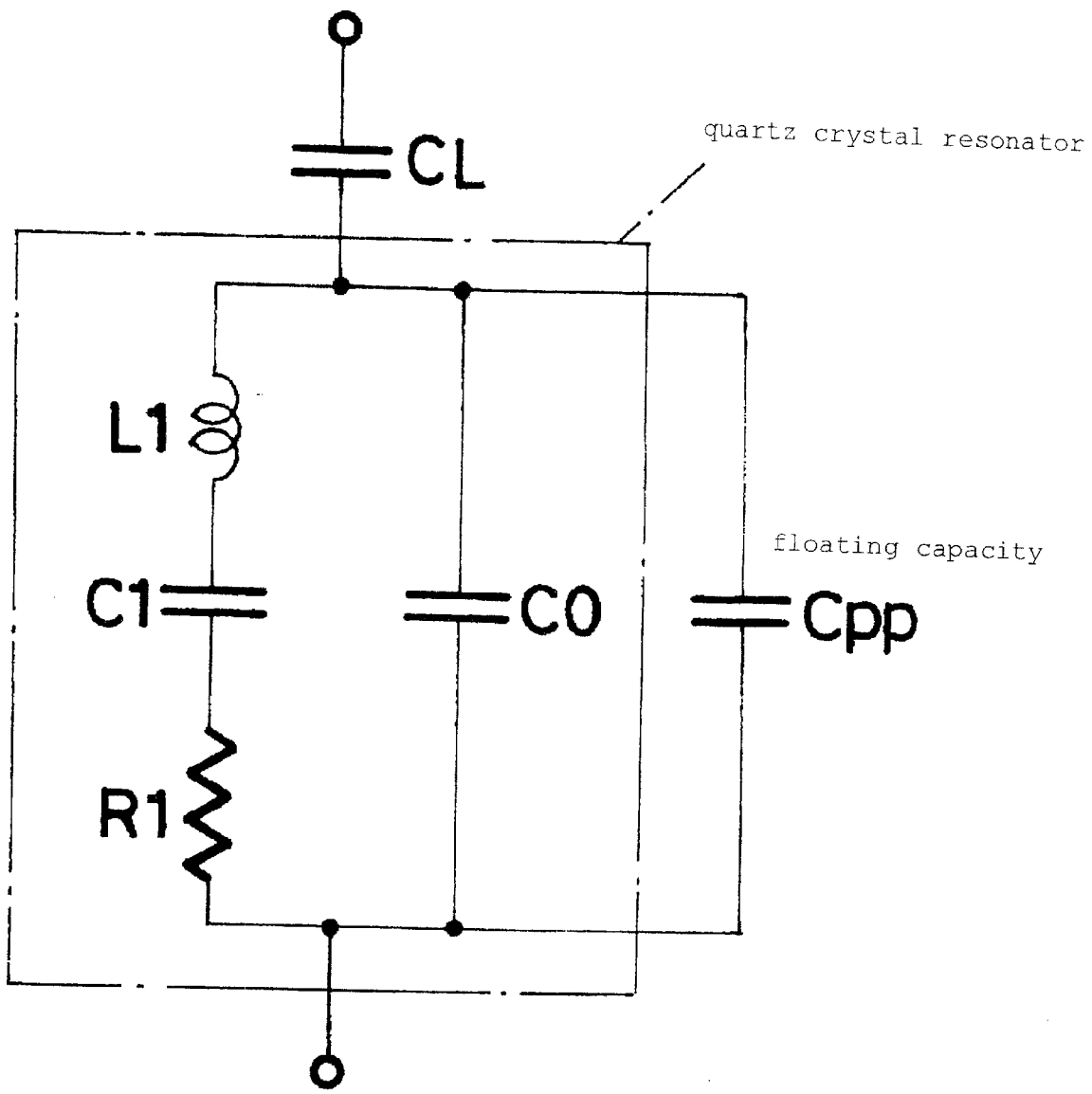
FIG. 5 is a schematic circuit diagram showing an actual equivalent circuit model of a quartz crystal oscillator.

FIG. 3 is a graph that shows results obtained by measuring the variable amount of frequency (ppm) of such a voltage controlled crystal oscillator. The horizontal axis is the applied voltage (V), and the vertical axis is the frequency deviation (ppm), which equals the variable amount of frequency ($\Delta F'$)/2. FIG. 2 also shows a related art quartz crystal oscillator, in which the quartz crystal resonator element is sealed in a package, and its oscillation circuit is connected as with individual discrete parts. In the quartz crystal oscillator of present invention, the variable amount of frequency also sharply increases by about 20% by essentially eliminating the stray capacity due to the gas adsorption of the quartz crystal resonator element, package and wiring structure.

The frequency deviation relating to the elapsed time is measured to analyze the aging characteristics for the same voltage controlled crystal oscillator of the present invention. As a result, it is confirmed that no essential changes or very small changes of the frequency deviation against the elapse of time are found, and superior aging characteristics can be displayed as compared with the quartz crystal oscillator of the related art structure, in which the quartz crystal resonator element and the IC chip including the oscillation circuit are loaded in same atmosphere of the same package.

In another embodiment, the wiring patterns 14 have test terminals that are exclusively used for the quartz crystal resonator element that is arranged in the second region 7b of the board 7. The vibration characteristics of the quartz crystal resonator element 2 can be measured in a state of mounting the IC chip 3 in the second region 7b by arranging such individual test terminals.

In still another embodiment, the second sidewall 11 enclosing the second region 7b can be omitted from the top side of the board 7. In this case, the IC chip 3 and the wiring patterns 14 that are mounted in the second region 7b are preferably sealed with a mold resin that has a higher viscosity than the potting material used in the embodiment of FIG. 1.

Suitable embodiments of present invention have been described in detail above, and as is clear to those skilled in the art, the present invention can also be provided by applying various changes and modifications to the above embodiments within the technical scope thereof. Moreover, the present invention can also be similarly suitable for the case of using resonator elements made of various piezoelectric materials other than quartz crystal.

What is claimed is:

1. A piezoelectric device, comprising:

a package having a board to form wiring patterns on one principal plane with a first region and a second region;

a first sidewall arranged above the board so as to enclose the first region and delimit a first internal void space;

a cover to join an upper end of the first sidewall and seal the first internal void space air-tightly;

a piezoelectric resonator element connected to the wiring patterns and mounted in the first internal void space; and electronic components connected to the wiring patterns and mounted in the second region, the electronic components and the wiring patterns of the second region being resin sealed.

2. The piezoelectric device of claim 1, the electronic components constituting an oscillation circuit of the piezoelectric resonator element.

3. The piezoelectric device of claim 1, the electronic components further including a variable capacitor.

4. The piezoelectric device of claim 1, the package further having a second sidewall with a lower height than the first sidewall formed on the board so as to enclose the second region and delimit a second void space to receive the electronic components internally.

5. The piezoelectric device of claim 4, the electronic components and the wiring patterns of the second region being resin sealed with a potting material injected into the inner side of the second sidewall.

6. The piezoelectric device of claim 1, the wiring patterns having test terminals for the piezoelectric resonator element which is arranged and resin sealed in the second region.

7. The piezoelectric device of claim 1, the cover including a metal plate and being joined to the first sidewall by seam welding.

8. The piezoelectric device of claim 1, the first sidewall being formed by laminating ceramic sheets with an opening of the first void space on the board.

* * * * *